United States Patent [19]

Chyung et al.

[11] Patent Number: 5,427,986
[45] Date of Patent: Jun. 27, 1995

[54] B-N-$C_x$ HYBRID COATINGS FOR INORGANIC FIBER REINFORCEMENT MATERIALS

[75] Inventors: Kenneth Chyung, Painted Post; John L. Stempin, Beaver Dams; Dale R. Wexell, Corning, all of N.Y.

[73] Assignee: Corning Incorporated, Corning, N.Y.

[21] Appl. No.: 431,161

[22] Filed: Oct. 16, 1989

[51] Int. Cl.⁶ ............................................. C04B 35/52
[52] U.S. Cl. ................................... 501/92; 501/95; 501/96; 501/97; 428/366
[58] Field of Search ................ 501/90, 92, 95–97; 428/364, 366, 375, 408

[56] References Cited

U.S. PATENT DOCUMENTS

| | | | |
|---|---|---|---|
| 4,376,803 | 3/1983 | Katzman | 428/408 |
| 4,376,804 | 3/1984 | Katzman | 428/408 |
| 4,397,901 | 8/1983 | Warren | 428/101 |
| 4,405,685 | 9/1983 | Honjo et al. | 428/368 |
| 4,464,475 | 8/1984 | Chyung et al. | 501/9 |
| 4,481,257 | 11/1984 | Suplinskas et al. | 428/366 |
| 4,485,179 | 11/1984 | Brennan et al. | 501/32 |
| 4,554,197 | 11/1985 | Chyung et al. | 428/113 |
| 4,589,900 | 5/1986 | Brennan et al. | 65/33 |
| 4,605,588 | 8/1986 | Simpson et al. | 428/375 X |
| 4,615,987 | 10/1986 | Chyung et al. | 501/8 |
| 4,642,271 | 2/1987 | Rice | 428/298 |
| 4,755,489 | 7/1988 | Chyung et al. | 501/8 |
| 4,981,822 | 1/1991 | Singh et al. | 501/92 X |
| 5,043,303 | 8/1991 | Singh et al. | 501/92 X |
| 5,055,430 | 10/1991 | Sakamoto et al. | 501/90 |

OTHER PUBLICATIONS

R. B. Kaner et al., "Boron–Carbon–Nitrogen Materials of Graphite-Like Structure", *Mat. Res. Bull.*, vol. 22, pp. 399–404 (1987).

*Primary Examiner*—Peter A. Nelson
*Attorney, Agent, or Firm*—Kees van der Sterre

[57] ABSTRACT

Inorganic reinforcing fibers comprising hybrid BN—C protective coatings containing up to 12% by weight of hexagonal (graphitic) carbon dissolved in the BN matrix but being essentially free of undissolved pyrolytic and graphitic carbon secondary phases, and fiber-reinforced ceramic matrix composite products incorporating the protectively-coated fibers, are disclosed. The fibers resist oxidation and provide good bonding interface characteristics when disposed in ceramic encapsulating materials, such that the composite products exhibit excellent resistance to high temperature embrittlement.

4 Claims, 1 Drawing Sheet

B-N-$C_x$ HYBRID COATINGS FOR INORGANIC FIBER REINFORCEMENT MATERIALS

BACKGROUND OF THE INVENTION

The present invention relates to inorganic composite materials of the class generally known as fiber-reinforced ceramic matrix composite materials. More specifically, the invention relates to inorganic reinforcing fibers for ceramic matrix composites incorporating B—N—$C_x$ coatings, such coatings imparting improved reinforcement capability to the fibers.

Fiber-reinforced ceramic matrix composites comprising glass-ceramic matrices are well known. U.S. Pat. No. 4,615,987 discloses silicon carbide fiber reinforced glass-ceramic composites wherein the matrix consists of an alkaline earth aluminosilicate glass-ceramic composition. Similar silicon-carbide-reinforced composites wherein the matrix consists of a barium-modified magnesium aluminosilicate glass-ceramic are reported in U.S. Pat. No. 4,589,900, while U.S. Pat. No. 4,755,489 discloses SiC-reinforced glass-ceramics wherein the glass-ceramic matrix contains excess $Al_2O_3$ and consists predominantly of anorthite in combination with mullite or alumina.

Prospective uses for fiber-reinforced ceramic matrix composites such as described in these and other prior patents and literature include use as a structural element in high temperature environments such as heat engines. Thus the materials to be employed must not only exhibit good strength and toughness at ambient temperatures, but must also retain those desirable physical properties at the elevated temperatures encountered in the operating environment. Temperatures in the range of 700°-1000° C. and highly oxidizing conditions (due to the high-temperature activity of oxygen) are considered representative of such operating conditions.

An important problem which has been identified in silicon carbide reinforced ceramic matrix composites in this temperature regime is that of high temperature embrittlement. Hence, instead of exhibiting high toughness and strength after exposure to temperatures in the operation ranges desired, these materials become brittle and subject to sudden catastrophic breakage, rather than more gradual failure as typical of the original material. While the exact mechanism of embrittlement has not been fully explained, oxidative deterioration of the fiber-matrix interface is the probable cause. See, for example, R. L. Stewart et al., "Fracture of SiC Fiber/Glass-Ceramic Composites as a Function of Temperature," in *Fracture Mechanics of Ceramics*, R. C. Bradt et al. Ed., Volume 7, pages 33-51, Plenum (New York) 1986.

It is known to provide coatings on fiber reinforcement to be incorporated in composite materials in order to modify the behavior of the materials or the fibers therein. Specifically, the use of boron nitride coatings on silicon carbide fibers or other fibers to be incorporated in ceramic matrix materials such as $SiO_2$, $ZrO_2$, mullite, and cordierite is known in the art. Thus U.S. Pat. No. 4,642,271 suggests that the high-temperature strength and toughness of a composite comprising an $SiO_2$ matrix and SiC reinforcing fibers may be significantly improved by coating the fibers with BN. This effect was, however, found to be dependent on the composition of both the fibers and the matrix, as the same fibers in other matrix materials did not always yield improved results. Thus, for example, BN-coated SiC fibers did not improve the characteristics of cordierite or $ZrO_2$ composite ceramics.

Other coating systems and coating matrix combinations are also known. U.S. Pat. No. 4,276,804, for example, describes the application to carbon fibers of a metal oxide film intended to improve fiber adhesion and wetting by a molten metallic matrix material. U.S. Pat. No. 4,397,901 describes a composite article and method for making it wherein a woven or non-woven fiber substrate, typically composed of carbon fibers, is provided with successive coatings of pyrolytic carbon, diffused silicon, and silicon carbide to provide a composite article resistant to corrosive conditions. U.S. Pat. No. 4,405,685 describes a similar coating system for carbon fibers wherein an inner coating consisting of a mixture of carbon and a selected metal carbide, in combination with an outer coating consisting solely of the metal carbide, are described. This dual coating system is intended to provide enhanced fiber protection for fibers to be embedded in ceramic or particularly metal matrix materials.

U.S. Pat. No. 4,481,257 discloses silicon carbide monofilaments coated with boron or boron carbide. These filaments exhibit improved strength and bonding when used with metal or epoxy matrix materials. U.S. Pat. No. 4,485,179 describes the use, in a ceramic matrix composite comprising silicon carbide fibers, of an agent added to the matrix to reduce interaction with the silicon carbide fibers. Tantalum or niobium compounds are useful for this purpose.

While the foregoing patents and literature indicate a general interest in the development of coatings for fibers to be employed for the reinforcement of composite glass, metal and ceramic materials, the problem of embrittlement of ceramic matrix composites comprising silicon carbide or other fibers remains.

It is therefore a principal object of the present invention to provide a fiber-reinforced ceramic matrix composite comprising inorganic reinforcing fibers which exhibits improved resistance to embrittlement under adverse high temperature conditions.

It is a further object of the invention to provide a method for making silicon carbide-reinforced glass-ceramic matrix composites which provides products of improved strength and/or toughness at high temperatures.

Other objects and advantages of the invention will become apparent from the following description thereof.

SUMMARY OF THE INVENTION

The present invention is founded upon the discovery of important composition variables unexpectedly affecting coating performance in protective fiber coatings comprising boron nitride. More particularly, it has been found that the controlled introduction of graphitic carbon into boron nitride (BN) coatings can significantly affect the functionality of these coatings as a fiber protection device and bonding control interface in ceramic matrix composite products.

The modified BN coatings of the present invention are broadly characterized as hybrid B—N—$C_x$ coatings wherein graphitic (hexagonal) carbon is present in controlled quantity in solid solution with hexagonal BN. These coatings offer substantial processing and performance advantages when used as protective fiber coatings in ceramic matrix composites. As an additional optional constituent, oxygen may be present in substantial proportion in these coatings. Although not required, the presence of up to 10% by weight of oxygen appears to increase the oxidation resistance of these coatings at temperatures up to about 1000° C., while up to 20% oxygen may be present without unduly degrading coating performance.

The importance of controlling the carbon content of the hybrid $B-N-C_x$ coatings of the invention arises because of the requirement to avoid the appearance of islands of pyrolytic or graphitic carbon in the coating. Such carbon is more prone to rapid oxidation and appears to promote the oxidation failure of the coating and underlying reinforcing fibers. In the absence of free pyrolytic or graphitic carbon, however, and provided an appropriate level of dissolved carbon is present, excellent coating stability performance as a barrier to fiber deterioration are achieved.

The hybrid $B-N-C_x$ coatings of the invention (hereinafter sometimes simply referred to as hybrid BN—C coatings) are suitably applied to selected fiber reinforcing materials by chemical vapor deposition from appropriate vapor mixtures of source compounds for the B, N, and C coating components. The fibers comprising the coating can then be incorporated into suitable glass, ceramic, or glass-ceramic matrix materials in accordance with well known composite fabrication procedures.

In one aspect, then, the invention comprises a coated inorganic fiber material suitable for ceramic matrix reinforcement wherein the fibers are provided with a surface coating of improved oxidation resistance. That surface coating may be characterized as a single-phase coating of graphite in solid solution with hexagonal BN. The coating will have a composition of the formula $B-N-C_x$ wherein x is in the range of 0.050–0.28 (corresponding to a carbon content of up to about 12% by weight), yet will be substantially and essentially free of undissolved pyrolytic and graphitic carbon secondary phases. The inorganic fibers may be of any appropriate composition but the preferred fiber materials are silicon carbide and silicon oxycarbide.

In a second aspect, the invention comprises a fiber-reinforced ceramic matrix composite article exhibiting excellent high-temperature strength and toughness comprising a ceramic matrix in which are disposed inorganic reinforcing fibers having a protective hybrid BN—C coating thereon. The protective BN—C coating has a stoichiometric composition corresponding approximately to $B-N-C_x$, wherein x is in the range of 0.050–0.28, and is characterized as a single-phase coating of graphite in solid solution with hexagonal BN which is substantially free of undissolved pyrolytic and graphitic carbon secondary phases. The matrix of the composite may be composed of a glass, a glass-ceramic, or a crystalline ceramic. For high temperature service, however, the matrix will preferably be selected from the group consisting of aluminosilicate glasses and aluminosilicate glass-ceramics.

In yet a third aspect, the invention includes an improved method for protectively coating an inorganic fiber to improve the oxidation resistance and bonding characteristics thereof to ceramic encapsulating materials. In accordance with that method, there is deposited onto the surface of the fiber a hybrid BN—C surface coating which is a single-phase coating of graphite in hexagonal (graphitic) BN. The coating will have a stoichiometric composition of approximately $B-N-C_x$, wherein x is in the range of about 0.050–0.28, yet the coating will be substantially and essentially free of undissolved pyrolytic and graphitic carbon secondary carbon phases.

In the particularly preferred coating method, the step of depositing the protective BN—C coating will comprise the step of contacting the surface of the fiber with a source gas mixture comprising source gases for B, N and C, wherein the concentration of the source gas for C is limited to a proportion effective to limit the carbon content of the coating to an amount not exceeding about 12% by weight.

As is evident from the above description, the hexagonal BN—C crystal phase present in the protective fiber coatings of the invention will typically comprise boron and nitrogen in an approximate stoichiometric ratio of 1:1. However, for purposes of the present description all references to BN, BN—C, and $B-N-C_x$ are intended to encompass variations in B:N ratio such as normally occur in the synthesis of nitride coatings. Thus, for example, coating stoichiometries corresponding to $B-N_y-C_x$ wherein x ranges 0.050–0.28 and y ranges 0.9–1.15 may readily be achieved without significantly affecting the structure or predominance of the hexagonal BN-based crystal phase, and such variations are well within the scope of the present invention as herein described.

DESCRIPTION OF THE DRAWINGS

The invention may be further understood by reference to the drawing, wherein.

DETAILED DESCRIPTION

Boron carbide-nitride deposits or layers have been described in the literature. One description of these materials is given by R. B. Kaner et al. in "Boron-Carbon-Nitrogen Materials of Graphite-Like Structure", *Mat. Res. Bull.*, Vol. 22, pp. 399–404 (1987). The deposits reported by Kaner et al. typically had compositions ranging from about $B_{0.485}N_{0.485}C_{0.03}$ to about $B_{0.35}N_{0.35}C_{0.30}$, and were prepared by vapor phase deposition via the thermal decomposition of mixtures of boron, nitrogen and carbon source compounds. The compositions of the deposits appeared to depend mainly on the temperature in the reaction zone wherein the source compounds were reacted to form the deposits.

As reported in U.S. Pat. No. 4,642,271, coatings of BN on reinforcing fibers of silicon carbide and mullite have been found to enhance the high-temperature toughness of certain kinds of composite materials, particularly those comprising $SiO_2$ as the matrix. However, the BN coatings employed, reportedly made from borazine ($B_3N_3H_6$), provided effective fiber protection only in a few selected matrix compositions, and were not reported to comprise deliberately added carbon. And, while carbon can be present as an impurity in commercially prepared BN-coated SiC fibers, both the concentrations and the morphology of the carbon present can vary substantially depending upon the coating supplier and the process used to synthesize the coating.

As previously noted, in the protective fiber coatings utilized in the present invention, the composition of the B—N—$C_x$ solid solution is controlled in order to insure that sufficient carbon of graphitic structure is present to enhance the protective capabilities of the coatings. At the same time, the maximum carbon content of the composition is limited to insure that islands of readily oxidizable carbon do not form in the coating, and that the coating remains smooth and continuous.

Figure 1:
FIG. 1 is an electron photomicrograph of a hybrid BN—C material comprising an identifiable second phase of graphite in the hybrid BN—C phase.
Figure 2:
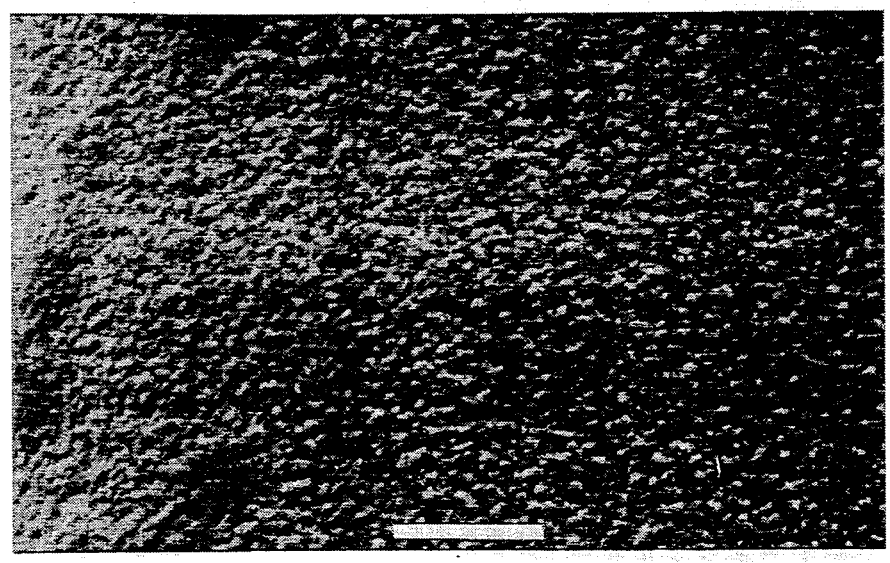
FIG. 2 is an electron photomicrograph of a hybrid BN—C material wherein the carbon is completely dissolved in the hybrid BN—C material.

FIGS. 1 and 2 of the drawing compare the microstructure of vapor-deposited boron nitride materials of differing carbon content and structure. FIG. 1 shows a deposit wherein the carbon content was not controlled, and wherein separate BN and carbon phases have been permitted to develop. FIG. 2, on the other hand, shows the structure of a carbon-containing BN deposit wherein the carbon is fully dissolved and contained within the hexagonal BN matrix of the material.

We have found that limiting the carbon content of the coating, preferably to a value not exceeding about 12% by weight, will in most cases avoid the formation of graphite inclusions or a separate graphite phase in the coating. In this way, the oxidation temperatures of the protective BN coating may be maintained at high levels and the electrical resistivity of the coatings will not be unduly reduced.

Vapor deposition comprises the most satisfactory method for providing BN—C coatings on inorganic fibers to be utilized for ceramic matrix reinforcement in accordance with the invention. Conventional vapor deposition processing may be utilized for this purpose.

A procedure known generally from the literature, involving deposition from a source gas mixture comprising $BCl_3$, $NH_3$ and acetylene provides a suitable vapor deposition method. A representative example of that procedure utilizes a reaction chamber provided by a bell jar of approximately 1 ft$^3$ capacity wherein the desired B—N—$C_x$ are deposited on substrates of fused silica, sapphire or alumina in vacuo. The bell jar comprises gas inlets through which $BCl_3$, $NH_3$ and acetylene ($C_2H_2$) source gases of high purity are supplied via ¼' I.D. stainless steel tubing to the deposition zone within the reaction chamber.

Flat substrates, composed for example of silica, sapphire or alumina, can be used to demonstrate the effective and controllable application of BN—C hybrid coatings by this process. A selected substrate, typically a small plate with a surface area not exceeding about 4 in$^2$ and a thickness not exceeding about 0.25 in, is positioned within the chamber on a resistance heated support of platinum foil. Surface temperatures on the substrates are monitored with a Pt/Rh thermocouple.

For best coating stoichiometry, volume gas flows of $BCl_3$ and $NH_3$ gas are maintained at $BN:NH_3$ ratios near 1:2. Acetylene flow is varied according to the dissolved carbon level desired in the resultant hybrid B—N—$C_x$ coating. Typical flow rates for $BCl_3$ are in the range of 0.1 to 0.01–1 pm, while acetylene is typically introduced at flow rates 25% or less of the $BCl_3$ flow rate. Substrate temperatures for acceptable coating deposition may range from 500°–800° C. with best results being achieved at substrate temperatures of about 700°–725° C. for substrates of this size.

The same reactants are appropriate for the deposition of hybrid coatings directly on silicon carbide fiber tows. Thus coatings comprising the BN—C hybrid moiety have been deposited on NLM-202 TM SiC fiber tows, commercially available from the Nippon Carbon Company of Tokyo, Japan, under a vacuum of 0.3 torr at 900° C. using reactant flow rates of 2.5–4.0 g/min of $BCl_3$, 0.75–1.70 g/min of $NH_3$, and 0.05–0.5 g/min of acetylene.

The overall deposition reaction (unbalanced) which proceeds among the above reactants under the described conditions can be written as follows:

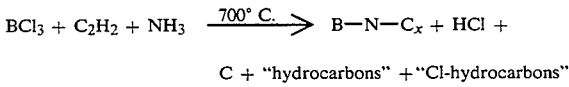

$$BCl_3 + C_2H_2 + NH_3 \xrightarrow{700° C.} B-N-C_x + HCl + C + \text{"hydrocarbons"} + \text{"Cl-hydrocarbons"}$$

The deposition procedure above described is capable of providing smooth and continuous BN—C coatings, with coating thicknesses of 1000–2500Å being achievable within deposition times of 5–10 min. Excessive acetylene flows, e.g., flows producing carbon levels of 12% or more in the deposit, are also undesirable from a processing standpoint in that powdery, non-coherent coatings are frequently produced.

Where carbon content in the deposited coating is maintained at a level below about 12% by weight, a true hybrid or solid solution coating is obtained. An independent graphite phase by itself would not be thermodynamically probable at this low temperature, and in fact X-ray diffraction analyses of such coatings show only a single-phase graphitic structure. Scanning electron photomicrographs of such coatings confirm the existence of continuous single-phase layers with no apparent islands of graphitic carbon in the BN hexagonal structure.

Representative examples of B—N—$C_x$ hybrid surface coatings produced in accordance with the above-described procedure are reported in Table I below. Included in Table I for each of several different example coatings are the stoichiometry of the coating, (with parenthetic reference to the resulting weight percentage of carbon in the coating), the log resistivity of the coating at room temperature, and the temperature of onset of coating oxidation (i.e., where $CO_2$ is detectable) when heated in air. All of the data is for the coatings as applied to sapphire ($Al_2O_3$) substrates.

Each of the hybrid coatings in Table I additionally contains oxygen as an impurity, at concentrations in the 2–5% (weight) range. The data given for the pure BN coating were taken from the literature.

TABLE I

| | BN—C Stoichiometries | | |
|---|---|---|---|
| Example No. | Coating Stoichiometry | Log R (Ω-cm) | Onset of Oxidation |
| 1 | $BN_{0.98}C_{1.05}$ (33.5% C) | 7.9 | 495° C. |
| 2 | $BN_{0.95}C_{0.92}$ (28.8% C) | 11.0 | 480° C. |
| 3 | $BN_{0.91}C_{0.50}$ (18.9% C) | 12.5 | 490° C. |
| 4 | $BN_{1.01}C_{0.37}$ (15.2% C) | 11.6 | 490° C. |
| 5 | $BN_{0.94}C_{0.27}$ (12.1% C | 14.0 | 750° C. |
| 6 | $BN_{0.87}C_{0.23}$ (10.0% C) | 14.2 | 775° C. |
| 7 | $BN_{1.05}C_{0.17}$ (7.4% C) | 14.4 | 780° C. |
| 8 | $BN_{0.95}C_{0.10}$ (4.6% C) | 14.1 | 790° C. |
| 9 | BN | 14.3 | 790° C. |

Referring to the data recorded in Table I, true hybrid BN—C coatings provided in accordance with the invention are illustrated by Examples 5–8. These coatings exhibit a graphitic structure similar in electrical resistance and oxidation behavior to that of pure BN, and thus can essentially duplicate the desirable electrical behavior and oxidation resistance of pure BN coatings. anorthite ($CaO.Al_2O_3.2SiO_2$) and its pseudo-binaries with mullite ($3Al_2O_3.SIO_2$), cordierite ($2MgO.2Al_2O_3.5SiO_2$), barium osumilite ($BaO.2MgO.3Al_2O_3.9SiO_2$), albite solid solution ($Na_2O.Al_2O_3.6SiO_2$), $Al_2O_3$, $SiO_2$, $CaO.SiO_2$, and gehlenite ($2CaO.Al_2O_3.SiO_2$).

Other refractory alkaline earth aluminosilicate glass-ceramics include those comprising a predominant crystal phase consisting essentially of triclinic anorthite in solid solution with at least one of mullite and alpha alumina, these glass-ceramics being disclosed in U.S. Pat. No. 4,755,489. Further, U.S. Pat. No. 4,464,475 discloses alkaline earth aluminosilicate glass-ceramics wherein the principal crystal phase is selected from the group consisting of barium osumilite, cordierite, and stuffed cordierite, the ions comprising the stuffing ions in the stuffed cordierite compositions being selected from the group consisting of Ba, Ca, Sr and $Cs_2O$. Barium-stuffed cordierite glass-ceramics, in particular, exhibit relatively low coefficients of thermal expansion and high elastic moduli.

For somewhat less demanding applications, matrix materials comprising lithium or zinc aluminosilicate glass-ceramics may be selected. U.S. Pat. No. 4,554,197 describes the use of glass-ceramic matrix materials of this type, which may also contain magnesium but which are typically essentially free of $TiO_2$. These glass-ceramics are characterized by the presence of a principal crystal phase selected from the group consisting of beta-quartz solid solution (sometimes referred to as beta-eucryptite solid solution) and beta spodumene solid solution.

Finally, the invention can be utilized for the strengthening and/or toughening of glass matrix materials as well. The preferred glasses are alkali-free alkaline earth aluminosilicate glasses, such glasses being substantially free of alkali metal oxides such as $Na_2O$, $Li_2O$, and $K_2O$, and including one or more alkaline earth metal oxides With excess carbon in the coatings, as in Examples 1–4 of Table I, the onset of coating oxidation occurs at significantly lower temperatures, and the electrical resistivity of the coatings is significantly reduced. These effects are attributed to the presence of free graphite in the coating layer, along with residual oxygen which is often present in proportions of up to about 5 wt % even in carefully synthesized BN coatings. Nevertheless, the oxidation behavior of these deposits is perhaps somewhat anomalous in view of the fact that preoxidized graphite, i.e., surface-oxidized graphite, is known to be more stable against further oxidation than pure graphite.

While the fibers presently preferred for use as a ceramic reinforcement material are silicon carbide fibers (also referred to as silicon oxycarbide fibers in the art), the invention is not limited to any particular type of fibers. Thus other refractory inorganic fibers useful for ceramic matrix reinforcement, including fibers of carbon, alumina, B4C, BN, zircon, mullite, spinel or silicon nitride, may also be used.

Specific examples of the preferred silicon carbide fibers include Nicalon ® silicon oxycarbide fibers, commercially available from the Nippon Carbon Co. of Tokyo, Japan. However, although the following description is mainly with reference to BN—C hybrid coatings as applied to commercial silicon carbide fibers, such description is intended to be illustrative and not limiting.

As is the case with the selection of fibers, the selection of a ceramic matrix material for reinforcement with fibers comprising hybrid BN—C coatings in accordance with the invention is not limited to any specific class of composition. For applications requiring best high temperature performance, refractory alkaline earth aluminosilicate glass-ceramics constitute the preferred matrix materials. Such glass-ceramics are disclosed, for example, in U.S. Pat. No. 4,615,987, and include glass-ceramics wherein the predominant crystal phase is selected from the group of selected from the group consisting of CaO, MgO, SrO and BaO.

As known in the art, long reinforcing fibers such as silicon carbide fibers can conveniently be incorporated into glass-ceramic matrix materials such as above described if the matrix materials are provided as glasses in particulate or powdered form. Such particulate matrix materials may readily be produced from glasses by drigaging, grinding and/or milling, with the glass powders thus produced being readily applied to the fibers in the form of liquid suspensions of the powders. Typically, these suspensions comprise dispersants and binder constituents in addition to the glass powders, and are applied by spraying or inversion of fibers or fiber tows or mats into the suspensions.

Fiber mats or tows impregnated with powdered glass as described may then be pressed or wound onto drums to provide green sheets or prepregs of the glass-impregnated fibers. These may then be stacked, if desired, and heated to achieve burnout of organics present in the coating vehicle.

Consolidation of the green prepregs or stacks thereof is typically accomplished by a hot pressing process during which the temperature is raised above the softening temperature of the glass and pressure is applied to eliminate voids in the material and produce a dense composite. In the case of glass-ceramic matrix materials, crystallization of the matrix material to effect conversion to a glass-ceramic matrix is usually achieved concurrently with consolidation in the course of the hot pressing process.

In the course of investigations leading to the present invention, commercially prepared BN coatings applied to silicon carbide fibers were carefully analyzed for composition and structure. A principal feature of these coatings was coating inhomogeneity; the typical coatings contained oxygen in combination with dissolved and undissolved carbon, but in proportions varying widely across the thickness of the coatings. Further, at least in surface regions of these coatings, very high carbon concentrations and islands of graphitic or pyrolytic carbon were found. The source of excess carbon in these coatings is unknown, although possible contamination from CVD reactor graphite walls and/or vacuum pump gases are likely.

In any event, as indicated above, we have now established that excessive carbon concentrations are clearly deleterious to coating stability. Thus the coatings of the present invention differ characteristically from prior art BN coatings in that carbon, although a critical constituent of the coating composition, is limited in concentration to insure that the coating is essentially free of uncombined graphitic carbon and other secondary carbon phases as determined by X-ray diffraction analysis.

The invention is more fully illustrated by the following detailed Example setting forth specific embodiments thereof.

EXAMPLE

A silicon carbide fiber material is first selected for coating. The selected fiber material is commercially available as Nicalon ® NLM 202 fiber tow, the tow being made up of approximately 500 SiC fibers of substantially cylindrical cross-section formed into a continuous bundle, and wherein the individual fibers have diameters of about 10-15 microns.

To apply a B—N—$C_x$ coating to these fibers, a polyvinyl acetate sizing is first removed therefrom by pyrolysis and the fibers are then placed in a large glass-walled vacuum chamber provided with a gas inlet for B, N and C source gases. Vacuum pumping means capable of removing air from the chamber without introducing significant pump fume impurities back into the chamber are also provided.

To apply a homogeneous B—N—$C_x$ coating to the fibers, a vacuum of 0.3 torr is drawn on the chamber and the fibers are heated to a temperature of approximately 900° C. Thereafter, a source gas mixture of $BCl_3$, $NH_3$ and acetylene is introduced into the chamber to initiate coating deposition onto the heated fibers. The source gas mixture includes $BCl_3$ at a flow rate of 2.86 g/min, $NH_3$ at a flow rate of 1.55 g/min, and acetylene at a flow rate of 0.48 g/min.

Reactant gas flow under these conditions is continued for a time interval of about 15 minutes, after which the flow of reactants is terminated and the fibers and vacuum chamber permitted to cool under vacuum. Thereafter the vacuum is released and the fibers removed from the chamber for examination.

Analyses conducted on samples of the coated fibers thus provided disclose that a hybrid B—N—$C_x$ coating having a thickness of about 0.1 microns has been deposited on the surfaces of the fibers. Chemical analysis indicates a coating stoichiometry of approximately $BN_{1.06}C_{0.24}$, the carbon content of the coating thus being approximately 10.2% by weight and the oxygen content being less than about 5% by weight. Electron photomicrograph and x-ray diffraction analyses show no evidence of islands of graphitic carbon on the exterior coating surfaces and no evidence of an identifiable free graphite phase in the deposited material. The coatings are of excellent homogeneity and resistance to oxidation.

Oxidation resistance in the coatings provided in accordance with the invention is demonstrated by incorporating coated fibers into ceramic matrix composite structures, and comparing the performance of the composites with identical composites incorporating uncoated fibers. For this purpose, fiber tows incorporating fibers with B—N—$C_x$ coatings produced in accordance with the above Example are combined with a powdered alkaline earth aluminosilicate glass precursor for a glass-ceramic matrix material. The precursor consists of a powdered calcium aluminosilicate glass having an oxide composition, in weight percent, of about 40.8% $SiO_2$, 39.7% $Al_2O_3$, 19.0% CaO, and 0.5% $As_2O_3$. The glass has an average particle size of about 10-15 microns, and the composition is suitable for conversion to a highly crystalline anorthite glass-ceramic matrix material upon suitable heat treatment.

A suspension of the powdered glass in an aqueous vehicle comprising conventional binders is next prepared and the coated fiber tow is impregnated with the powdered glass by drawing it through the suspension and winding it onto a drum to form a cylindrical fiber layup. The layup comprising the fibers and powdered glass is then dried, cut from the drum, and stretched flat, and preform sheets are cut from the flattened sheet for stacking into a composite preform.

The cut sheet samples are preliminarily heated for binder burnout at 450° C. in nitrogen, and then panels of dense glass-ceramic matrix composite material are prepared by stacking and consolidating the sheet samples with heat and pressure. Stacks of eight sheets in fiber-parallel alignment are consolidated by hot pressing at temperatures in the range of about 1200°-1360° C. at pressures in the range of about 1500-3000 psi. This treatment is effective both to remove voids from the material and convert the preform stack to a dense crystalline glass-ceramic plate comprising an anorthite glass-ceramic matrix reinforced with hybrid BN—C-coated silicon carbide fibers.

The effectiveness of the hybrid coating in protecting the silicon carbide fiber reinforcement from high-temperature oxidation damage can be evaluated by testing composites produced as described for high temperature embrittlement. The samples to be evaluated are tested for microcrack yield stress (MCY) and ultimate flexural strength (UFS) both at ambient temperature (25° C.) and at an elevated test temperature of 1000° C. Although the residence time of the test sample at the elevated temperature is short, that time is sufficient to produce substantial embrittlement in conventional ceramic composite materials comprising silicon carbide fibers with no BN coating.

In addition to low high-temperature strength, the extent of embrittlement of composites exposed to this testing is further indicated by changes in fracture habit. Tough, non-brittle samples show fracture characterized by fiber pullout from the matrix (a so-called fibrous fracture habit), whereas woody or brittle fracture habits suggest increasing levels of embrittlement. Woody fracture surfaces display some crack propagation parallel to the stress axis, indicating localized shear failure but without fibrous pullout, whereas brittle fracture surfaces display merely planar fracture surfaces.

Table II below reports data resulting from the described embrittlement testing of two composite samples comprising hybrid BN—C-coated silicon carbide fibers and one sample comprising uncoated silicon carbide fibers. The coated fibers were prepared in accordance with the coating procedure of the above Example.

Included in the Table for each of the samples tested are an identification of the fibers used in the composites, as well as composition data for the BN—C hybrid coatings, where present, and an indication of the consolidation conditions employed to densify and crystallize the composites. Also included in the Table are the microcrack yield (MCY) stress and ultimate flexural stress (UFS) levels exhibited by the samples, the sample elongation (Elong.) or strain at the ultimate flexural stress point, and a qualitative evaluation of the fracture habit observed at the point of ultimate flexural failure.

TABLE II

| | Composite Test Data | | |
|---|---|---|---|
| Sample | A | B | Control |
| Fiber | NLM-202 SiC | NLM-202 SiC | NLM-202 SiC |
| Coating | $BN_{1.06}C_{0.24}$ | $BN_{1.06}C_{0.24}$ | None |
| Consol. | 1300° C. @ | 1200° C. @ | 1340° C. @ |

TABLE II-continued

| | Composite Test Data | | |
|---|---|---|---|
| Sample | A | B | Control |
| Treat. | 1500 psi | 3000 psi | 1500 psi |
| *Fracture at 25° C.* | | | |
| MCY | 58 ksi | 49 ksi | 45 ksi |
| UFS | 98 ksi | 109 ksi | 85 ksi |
| Elong. | 0.68% | 0.77% | 0.54% |
| Fracture Mode | Fibrous/ Woody | Woody/ Fibrous | Fibrous |
| *Fracture at 1000° C.* | | | |
| MCY | 38 ksi | 38 ksi | 35 ksi |
| UFS | 72 ksi | 68 ksi | 45 ksi |
| Elong. | 0.69% | 0.78% | 0.25% |
| Fracture Mode | Woody/ Fibrous | Woody/ Fibrous | Woody/ Brittle |

Significant features of the invention as shown by the data in Table II are the high level of retained strength of the samples comprising BN—C hybrid coatings on the reinforcing fibers, even at 1000° C. Thus these materials retain ultimate flexural strengths in excess of 65 ksi when tested at 1000° C. In addition, the samples show at least some fiber pullout at 1000° C., behavior which is in marked contrast with that shown by the control sample. Finally the coated fiber samples show excellent toughness in flexural failure, as manifested by elongation or ultimate failure strain values which are substantially equivalent both at room temperature and at 1000° C. In contrast the low failure strain of the control sample, particularly at 1000° C., is a good indicator of the extensive embrittlement manifested by this material.

While the invention has been particularly described above with respect to specific materials and specific procedures, it will be recognized that those materials and procedures are presented for purposes of illustration only and are not intended to be limiting. Thus numerous modifications and variations upon the compositions and processes specifically described herein may be resorted to by those skilled in the art within the scope of the appended claims.

We claim:

1. A coated inorganic fiber material having an oxidation-resistant surface coating, wherein the surface coating is a single-phase coating of graphite in hexagonal BN, wherein the coating:
   has a composition of the formula B—N—$C_x$ wherein x is in the range of 0.050–0.28; and
   is substantially free of undissolved pyrolytic and graphitic carbon secondary phases.

2. A coated inorganic fiber material in accordance with claim 1 wherein the fibers are fibers having a composition selected from the group consisting of silicon carbide, silicon oxycarbide, carbon, alumina, B4C, BN, zircon, mullite, spinel and silicon nitride.

3. A coated inorganic fiber material in accordance with claim 2 wherein the fibers are composed of silicon oxycarbide.

4. Inorganic fibers comprising a carbon-containing vapor-deposited boron nitride coating on the surfaces thereof, wherein the carbon is in solid solution with the boron nitride, wherein the carbon content does not exceed about 12% by weight of the coating, and wherein the coating is substantially free of undissolved pyrolytic and graphitic carbon secondary phases.

* * * * *

UNITED STATES PATENT AND TRADEMARK OFFICE
CERTIFICATE OF CORRECTION

PATENT NO. : 5,427,986
DATED : June 27, 1995
INVENTOR(S) : Kenneth Chyung, John L. Stempin, Dale R. Wexell It is certified that error appears in the above-indentified patent and that said Letters Patent is hereby corrected as shown below:

Column 5, line 40, change "1/4'" to --1/4"--

Column 6, Table 1, Example 5, change "C." to --C.)--.

Column 8, line 27, change "inversion" to --immersion--.

Column 8, line 14, after "group of", move and insert entire text of Column 7, lines 5-42.

Signed and Sealed this

Nineteenth Day of September, 1995

Attest:

BRUCE LEHMAN

*Attesting Officer*  *Commissioner of Patents and Trademarks*